United States Patent
Takada et al.

(10) Patent No.: US 9,989,237 B2
(45) Date of Patent: Jun. 5, 2018

(54) LIGHT SOURCE DEVICE

(71) Applicant: USHIO DENKI KABUSHIKI KAISHA, Tokyo (JP)

(72) Inventors: Hiroyuki Takada, Tokyo (JP); Masaki Inoue, Tokyo (JP); Osamu Osawa, Tokyo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 0 days. days.

(21) Appl. No.: 15/560,271

(22) PCT Filed: Feb. 15, 2016

(86) PCT No.: PCT/JP2016/054259
§ 371 (c)(1),
(2) Date: Sep. 21, 2017

(87) PCT Pub. No.: WO2016/158034
PCT Pub. Date: Oct. 6, 2016

(65) Prior Publication Data
US 2018/0073716 A1    Mar. 15, 2018

(30) Foreign Application Priority Data

Mar. 30, 2015    (JP) .................................. 2015-069728

(51) Int. Cl.
*H01L 33/64*    (2010.01)
*F21V 29/504*    (2015.01)
(Continued)

(52) U.S. Cl.
CPC .............. *F21V 29/713* (2015.01); *F21K 9/64* (2016.08); *F21K 9/68* (2016.08); *F21K 9/69* (2016.08);
(Continued)

(58) Field of Classification Search
CPC ... H01L 33/507; H01L 33/644; H01L 33/648; F21V 29/502–29/504; F21V 29/51;
(Continued)

(56) References Cited

U.S. PATENT DOCUMENTS

| | | | |
|---|---|---|---|
| 5,023,442 A * | 6/1991 | Taniguchi | B41J 2/451 250/208.1 |
| 2014/0084325 A1 | 3/2014 | Yamanaka et al. | |
| 2014/0176915 A1* | 6/2014 | Yamamoto | H04N 9/31 353/31 |

FOREIGN PATENT DOCUMENTS

| | | |
|---|---|---|
| CN | 102720954 A | 10/2012 |
| JP | 2006-013265 A | 1/2006 |

(Continued)

OTHER PUBLICATIONS

Notification of Transmittal of Translation of the International Preliminary Report on Patentability and Translation of Written Opinion of the International Searching Authority; PCT/JP2016/054259; dated Oct. 12, 2017.

(Continued)

*Primary Examiner* — Andrew Coughlin
*Assistant Examiner* — Steven Horikoshi
(74) *Attorney, Agent, or Firm* — Studebaker & Brackett PC (57) ABSTRACT

A light source device includes a light emitting element adapted to emit exciting light; a fluorescent element having a phosphor and adapted to convert at least a portion of the exciting light emitted from the light emitting element into fluorescence and to reflect the fluorescence; and a common cooling member adapted to cool the light emitting element and the fluorescent element. The cooling member includes a first cooling surface coupled to the light emitting element for cooling the light emitting element, and a second cooling surface coupled to the fluorescent element for cooling the (Continued)

fluorescent element. The first cooling surface and the second cooling surface are placed in parallel with each other and are placed in such a way as to be oriented in the same direction.

3 Claims, 8 Drawing Sheets

(51) Int. Cl.
| | |
|---|---|
| *F21V 29/503* | (2015.01) |
| *F21V 29/71* | (2015.01) |
| *F21V 29/51* | (2015.01) |
| *F21K 9/64* | (2016.01) |
| *F21K 9/68* | (2016.01) |
| *F21K 9/69* | (2016.01) |
| *F21V 29/76* | (2015.01) |
| *F21Y 115/10* | (2016.01) |
| *F21Y 115/30* | (2016.01) |

(52) U.S. Cl.
CPC ............ *F21V 29/503* (2015.01); *F21V 29/51* (2015.01); *F21V 29/763* (2015.01); *H01L 33/644* (2013.01); *H01L 33/648* (2013.01); *F21Y 2115/10* (2016.08); *F21Y 2115/30* (2016.08)

(58) Field of Classification Search
CPC . F21V 17/06; F21V 5/008; F21K 9/64; G02B 19/0052; G02B 19/0057; G03B 21/204; F21S 41/16; F21S 41/176; F21S 43/16
See application file for complete search history.

(56) References Cited

FOREIGN PATENT DOCUMENTS

| | | |
|---|---|---|
| JP | 2007-208116 A | 8/2007 |
| JP | 2007-294754 A | 11/2007 |
| JP | 2011-243808 A | 12/2011 |
| JP | 2012-244085 A | 12/2012 |
| JP | 2015-015274 A | 1/2015 |
| WO | 2013/008361 A1 | 1/2013 |

OTHER PUBLICATIONS

International Search Report issued in PCT/JP2016/054259; dated Apr. 5, 2016.
An Office Action; "Decision to Grant a Patent," issued by the Japanese Patent Office dated Aug. 18, 2016, which corresponds to Japanese Patent Application No. 2015-069728.

* cited by examiner

LIGHT SOURCE DEVICE

TECHNICAL FIELD

The present invention relates to light source devices including light emitting elements for emitting exciting light, and a fluorescent element for converting at least a portion of the exciting light emitted from the light emitting elements into fluorescence and for reflecting the fluorescence.

BACKGROUND ART

Conventionally, there have been known light source devices including light emitting elements for emitting exciting light, and a fluorescent element for converting the exciting light emitted from the light emitting elements into fluorescence and for reflecting the fluorescence (for example, Patent Document 1). In such light source devices, the light emitting elements generate heat when emitting light, and the fluorescent element generates heat when converting exciting light into fluorescence. For coping therewith, in the light source device according to Patent Document 1, it is necessary to provide means for cooling the light emitting elements, and means for cooling the fluorescent element, separately from each other.

PRIOR ART DOCUMENTS

Patent Documents

Patent Document 1: JP-A-2007-294754

SUMMARY OF THE INVENTION

Problems to be Solved by the Invention

For coping therewith, in view of the circumstances, it is an object of the present invention to provide a light source device capable of employing common means for cooling light emitting elements and a fluorescent element.

Means for Solving the Problems

There is provided a light source device, which includes:
a light emitting element adapted to emit exciting light;
a fluorescent element having a phosphor and adapted to convert at least a portion of the exciting light emitted from the light emitting element into fluorescence and to reflect the fluorescence; and
a common cooling member adapted to cool the light emitting element and the fluorescent element, wherein
the cooling member includes a first cooling surface coupled to the light emitting element for cooling the light emitting element, and a second cooling surface coupled to the fluorescent element for cooling the fluorescent element, and
the first cooling surface and the second cooling surface are placed in parallel with each other and are placed in such a way as to be oriented in the same direction.

Also, the light source device may have a configuration in which:
the first cooling surface and the second cooling surface are placed in the same plane.

Also, the light source device may have further:
at least one condenser lens adapted to condense reflected light having been reflected by the fluorescent element, such that the reflected light is incident on a first surface, and the reflected light is emitted from a second surface, wherein
the condenser lens is adapted to condense the exciting light emitted from the light emitting element, such that the exciting light is incident on the second surface, and the exciting light is emitted from the first surface toward the fluorescent element.

Also, the light source device may have further:
a lens holding member which is adapted to hold the condenser lens and is coupled to the second cooling surface for cooling the condenser lens, wherein
the lens holding member encloses the fluorescent element, in cooperation with the condenser lens and the second cooling surface.

Also, the light source device may have a configuration in which:
the first cooling surface has higher cooling ability than cooling ability of the second cooling surface.

Effect of the Invention

As described above, the light source device according to the present invention provides an excellent advantage of employing common means for cooling the light emitting element and the fluorescent element.

MODE FOR CARRYING OUT THE INVENTION

Hereinafter, an embodiment of a light source device will be described, with reference to FIGS. 1 to 7. Further, throughout the respective drawings (similarly to FIG. 8), dimension ratios in the drawings are not always equal to the actual dimension ratios.

Figure 1:
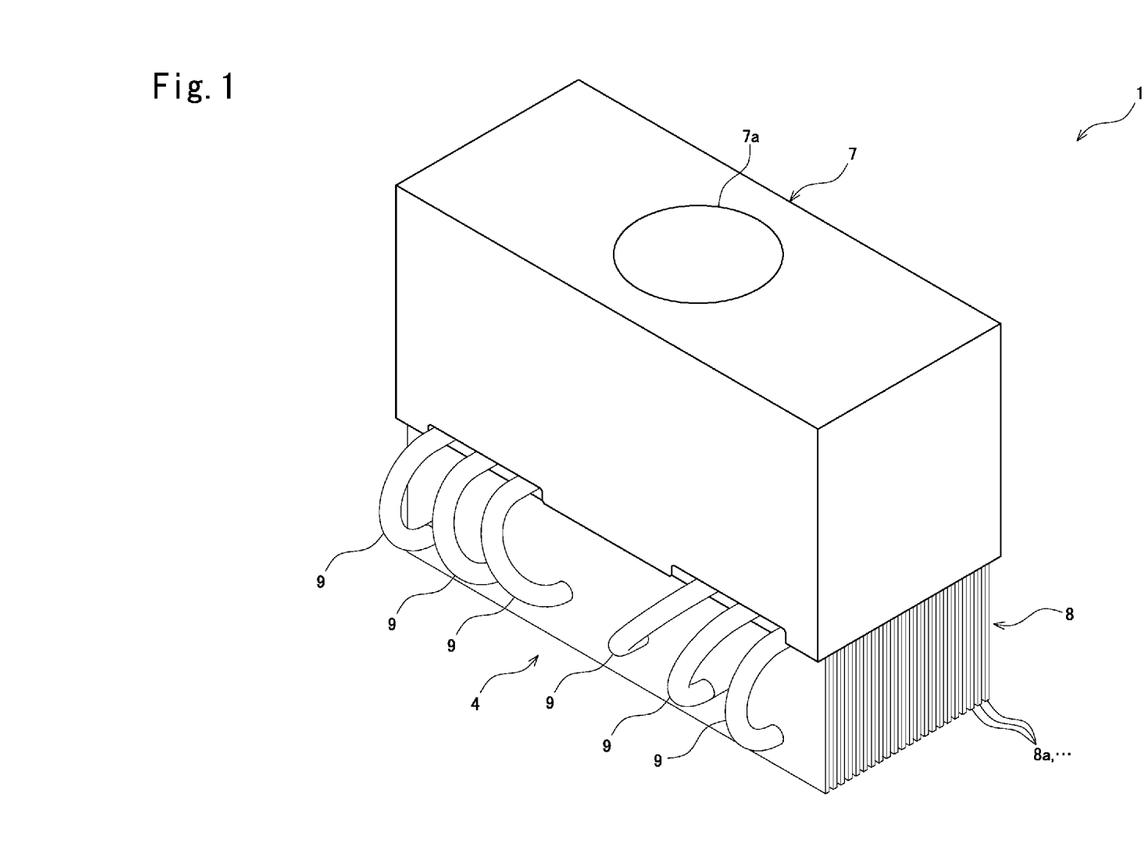
FIG. 1 is a perspective view of entirety of a light source device according to an embodiment.
Figure 2:
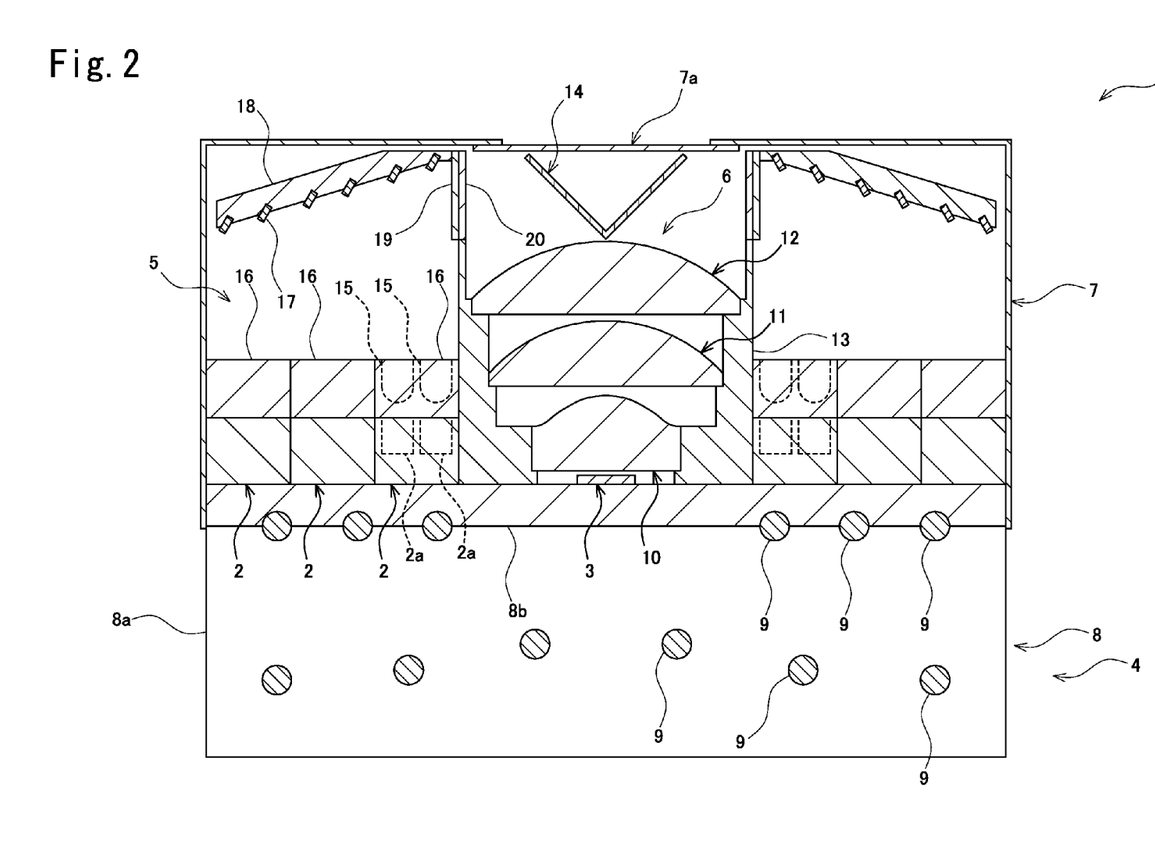
FIG. 2 is a longitudinal cross sectional view of the entirety of the light source device according to the embodiment.

As illustrated in FIGS. 1 and 2, a light source device 1 according to the present embodiment includes a plurality of light emitting elements 2 adapted to emit exciting light, a fluorescent element 3 adapted to convert a portion of the exciting light emitted from the light emitting elements 2 into fluorescence and to reflect the fluorescence, and a common cooling member 4 for cooling the light emitting devices 2 and the fluorescent element 3. Further, the light source device 1 includes a first optical system (an exited-light optical system) 5 adapted to cause the exciting light emitted from the light emitting elements 2 to propagate toward the fluorescent element 3, and a second optical system (a reflected-light optical system) 6 adapted to cause the reflected light having been reflected by the fluorescent element 3 to propagate toward the outside.

Further, the light source device 1 includes a casing 7 for housing the light emitting elements 2, the fluorescent element 3, the first optical system 5, and the second optical system 6. The casing 7 includes an emission port portion 7a with translucency for emitting, toward the outside, the reflected light having been reflected by the fluorescent element 3.

The light emitting elements 2 are constituted by semiconductor lasers. In the present embodiment, the light emitting elements 2 are of an array type including light emitting portions 2a in two rows (in the leftward and rightward direction in FIG. 2) and 12 columns (in the vertical direction with respect to the paper plane of FIG. 2). Further, the light emitting elements 2 can either be CAN-type semiconductor lasers each having a single light emitting portion 2a or be LEDs. Further, in the present embodiment, the light emitting elements 2 emit blue light (light with wavelengths of 430 to 470 nm, for example).

The fluorescent element 3 includes a phosphor. In the present embodiment, the fluorescent element 3 is constituted by a plate-shaped polycrystal member created by mixing a phosphor formed from a YAG-based crystal material with an aluminum oxide and the like. Also, the fluorescent element 3 can be created by mixing a powdery phosphor into a binder formed from silicone and the like and, then, applying it to a base material.

Further, the fluorescent element 3 includes a reflective film formed from a dielectric multi-layer film, over the surface of the fluorescent element 3 (the lower surface in FIG. 2) closer to the cooling member 4, such that light incident thereto is reflected toward the second optical system 6. Further, reflected light having been reflected by the fluorescent element 3 contains not only light having been mirror-reflected (regularly-reflected) by the fluorescent element 3, but also light having been diffuse-reflected by the fluorescent element 3, and light to be incident on the second optical system 6 (more specifically, a first condenser lens 10 which will be described later) after having been incident on the fluorescent element 3 and having been scattered by the fluorescent element 3.

Further, the fluorescent element 3 converts a portion of the exciting light emitted from the light emitting elements 2 into fluorescence. Accordingly, the reflected light having been reflected by the fluorescent element 3 contains fluorescence resulted from the conversion by the fluorescent element 3, and un-converted light (light maintained at exited light) having not been subjected to the conversion by the fluorescent element 3. In the present embodiment, the fluorescent element 3 converts a portion of the blue light, which is the exited light emitted from the light emitting elements 2, into fluorescence in an yellow green color (for example, light with wavelengths with a peak falling within the range of 525 to 575 nm and with a spectrum over a wide visible region over the range of 450 to 800 nm).

The fluorescent element 3 is placed between the light emitting elements 2. More specifically, the fluorescent element 3 is placed between a pair of groups of plural light emitting elements 2 (three light emitting elements 2 in the present embodiment) which are arranged. Further, the direction of propagation of the reflected light having been reflected by the fluorescent element 3 is substantially the same direction (the upward direction in FIG. 2) as the direction of propagation of the exited light emitted from the light emitting elements 2.

The cooling member 4 includes a heat sink 8 having plural fins 8a formed to have a thin-plate shape. Further, the cooling member 4 includes heat pipes 9 filled with a liquid, in which a porous material or the like is interiorly attached to the insides of these pipes which are enclosed and a base member 8b which is coupled at one side of the heat sink 8 (the upper side in FIG. 2) to the light emitting elements 2 and the fluorescent element 3 and, also, is coupled to the fins 8a at the other side of the heat sink 8 (the lower side in FIG. 2).

Figure 3:
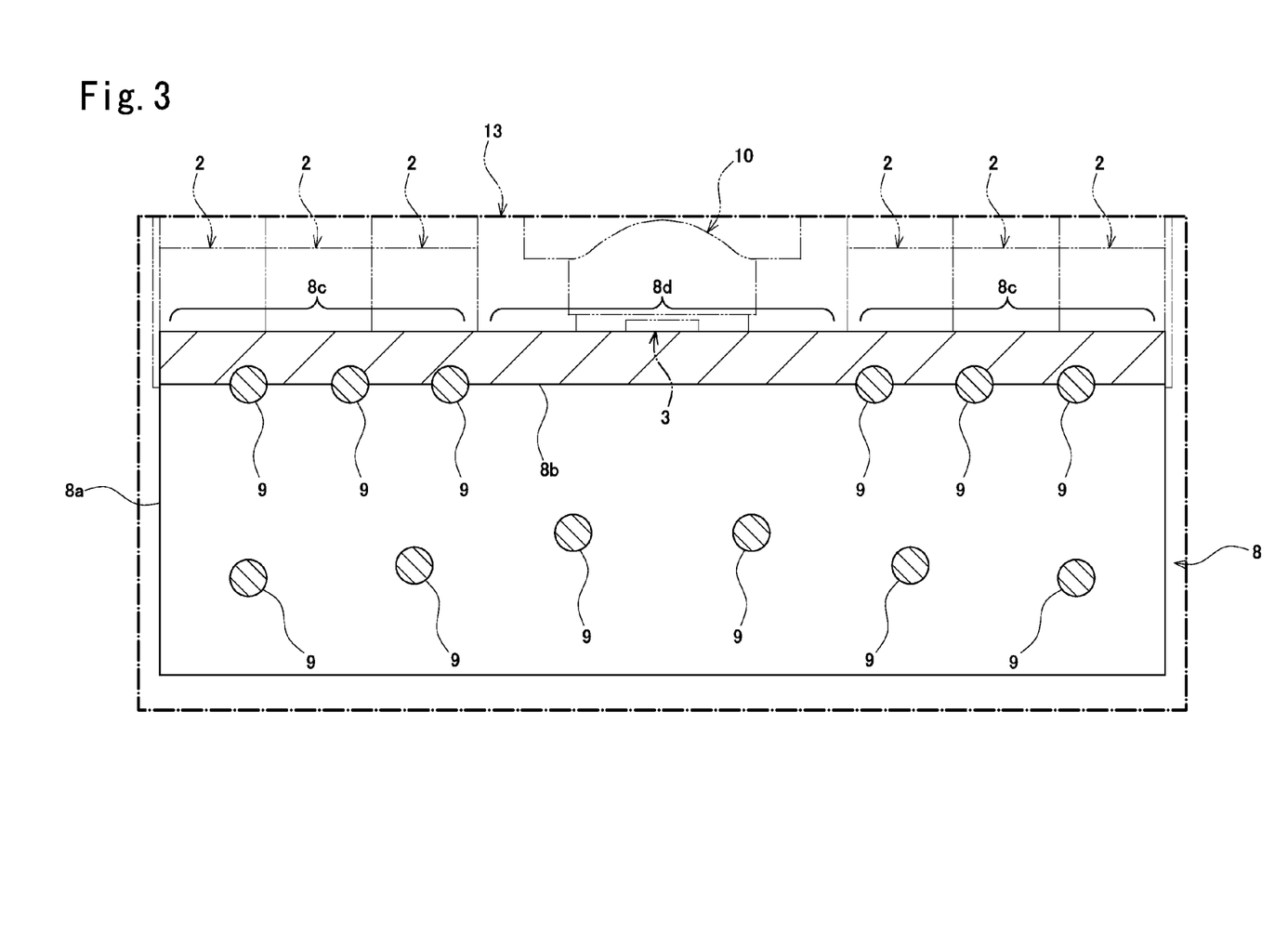
FIG. 3 is a longitudinal cross sectional view of main parts of the light source device according to the embodiment.

As illustrated in FIG. 3, the heat sink 8 includes a pair of first cooling surfaces 8c and 8c which are coupled to the light emitting elements 2 for cooling the light emitting elements 2, and a second cooling surface 8d which is coupled to the fluorescent element 3 for cooling the fluorescent element 3. Further, the respective elements 2 and 3 can either be coupled directly to to the respective cooling surfaces 8c and 8d, or be coupled to the respective cooling surfaces 8c and 8d with heat transfer members interposed between the respective elements 2, 3 and the respective cooling surfaces 8c and 8d.

The first cooling surfaces 8c and the second cooling surface 8d are placed in parallel (including not only complete parallel, but also approximate parallel) with each other and, also, are placed in such a way as to be oriented in the same direction. In the present embodiment, the first cooling surfaces 8c and the second cooling surface 8d are placed in the same plane (including not only completely the same plane but also substantially the same plane). The pair of the first cooling surfaces 8c and 8c are placed in the opposite sides beside the second cooling surface 8d, in such away as to sandwich the second cooling surface 8d. In other words, the second cooling surface 8d is placed between the pair of the first cooling surfaces 8c and 8c.

The heat pipes 9 are placed more closely to the first cooling surfaces 8c, than to the second cooling surface 8d. Thus, the first cooling surfaces 8c have higher cooling ability than the cooling ability of the second cooling surface 8d.

Figure 4:
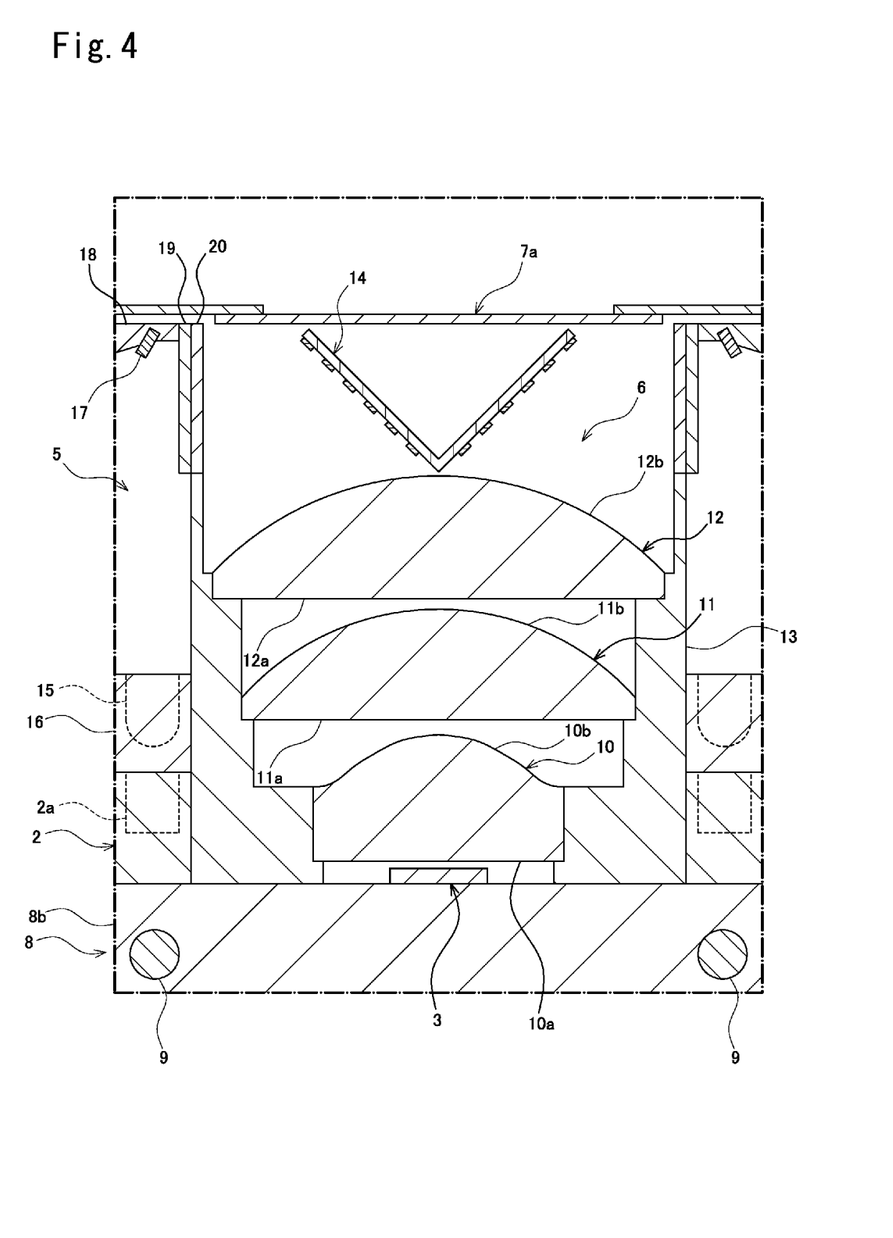
FIG. 4 is a longitudinal cross sectional view of main parts of the light source device according to the embodiment.
Figure 5:
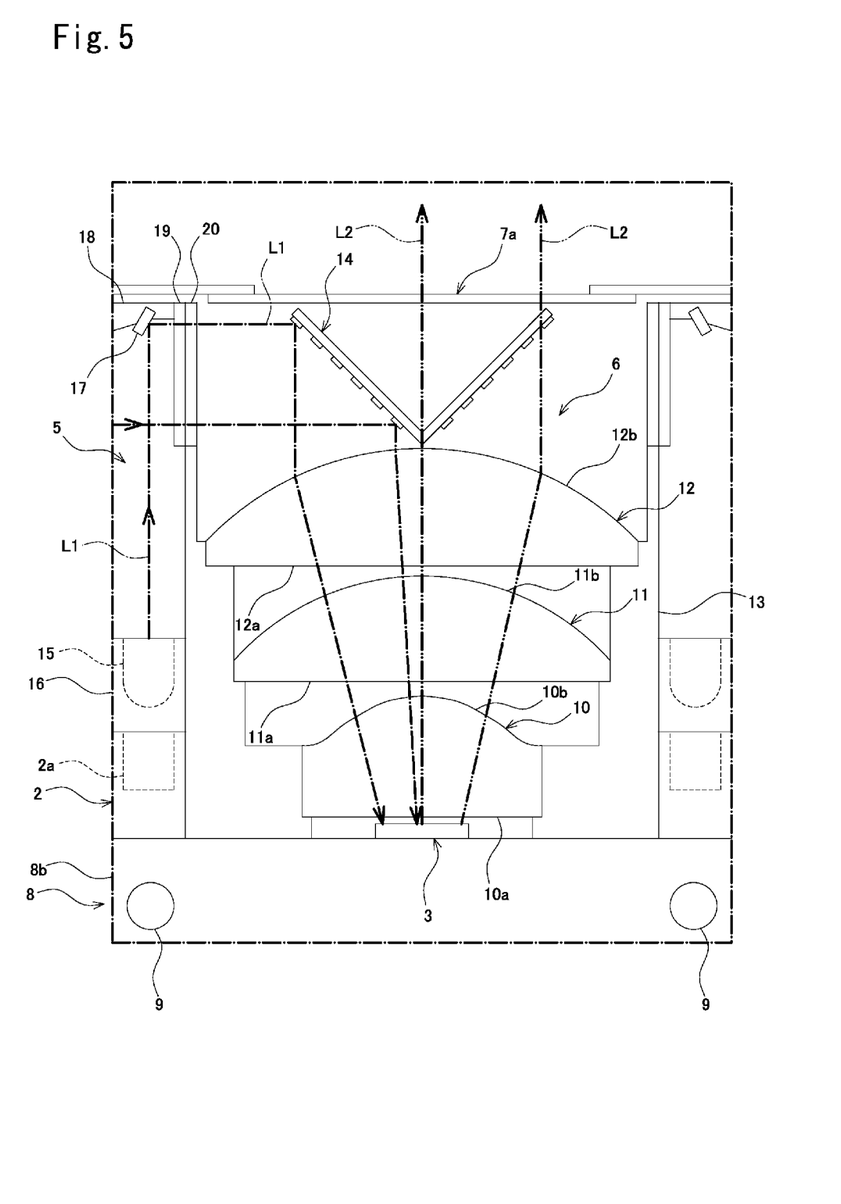
FIG. 5 is a longitudinal cross sectional view of main parts of the light source device according to the embodiment, illustrating propagation of light.

As illustrated in FIGS. 4 and 5, the second optical system 6 includes first to third condenser lenses 10, 11 and 12 to which reflected light L2 having been reflected by the fluorescent element 3 is incident, and a lens holding member 13 which holds the respective condenser lenses 10, 11 and 12. Further, the second optical system 6 includes an optical element 14 which passes, therethrough, at least a portion of the reflected light L2 emitted from the third condenser lens 12.

In the present embodiment, there are provided the three condenser lenses 10, 11 and 12, but there can be also provided one, two, four or more condenser lenses. Further, in FIG. 5, in the left half portion, there is illustrated a path (an one-dot chain line) of the exciting light L1 emitted from the light emitting elements 2 up to the fluorescent element 3, while, in the right half portion, there is illustrated the path (a two-dot chain line) of the reflected light L2 having been reflected by the fluorescent element 3 up to the outside.

The respective condenser lenses 10, 11 and 12 condense the reflected light L2, since the reflected light L2 having been reflected by the fluorescent element 3 is incident on the first surfaces 10a, 11a, and 12a, and the reflected light L2 is emitted from the second surfaces 10b, 11b and 12b. Further, the term "condensing light" includes not only converging light, but also making light parallel, and making the spread of incident light larger than the spread of emitted light.

The lens holding member 13 is formed to have a tubular shape, and is adapted to place the respective condenser lenses 10, 11 and 12 therewithin. Further, the lens holding member 13 is coupled to the second cooling surface 8*d* of the heat sink 8, for cooling the respective condenser lenses 10, 11 and 12. Further, the lens holding member 13 encloses the fluorescent element 3, in cooperation with the first surface 10*a* of the first condenser lens 10 and the second cooling surface 8*d* of the heat sink 8.

Also, the lens holding member 13 can either be directly coupled to the second cooling surface 8*d*, or be coupled to the second cooling surface 8*d* with a heat transfer member interposed between the lens holding member 13 and the second cooling surface 8*d*. Further, the lens holding member 13 has heat conductivity. In the present embodiment, the lens holding member 13 is formed from a material with excellent heat conductivity, such as aluminum, for example.

Further, the respective condenser lenses 10, 11 and 12 can be held on the lens holding member 13 through mechanical securing means, for example. Further, the respective condenser lenses 10, 11 and 12 can be also held on the lens holding member 13 through an adhesive agent. For example, the adhesive agent can be prevented from being heated and burned, since the lens holding member 13 is cooled by the heat sink 8. Further, for example, the number of members can be reduced, which can simplify the design, in comparison with the case of mechanical securing means.

The first optical system 5 includes a collimator lens 15 for making the exciting light L1 emitted from the light emitting elements 2 parallel light, and a collimator-lens supporting member 16 for supporting the collimator lens 15. Further, the first optical system 5 includes a reflection mirror 17 for reflecting the exciting light L1 emitted from the collimator lens 15, and a mirror supporting member 18 for supporting the reflection mirror 17. Further, the first optical system 5 includes a prism lens 19 and a diffusion plate 20 which are adapted to pass, therethrough, the exciting light L1 having been reflected by the reflection mirror 17.

On the other hand, the respective condenser lenses 10, 11 and 12 and the optical element 14, which constitute the second optical system 6, also constitute the first optical system 5. Namely, the first optical system 5 and the second optical system 6 share partial structures with each other. More specifically, the first optical system 5 and the second optical system 6 share the respective condenser lenses 10, 11 and 12 and the optical element 14 with each other.

The optical element 14 reflects the exciting light L1 having passed through the prism lens 9 and the diffusion plate 20. Further, the respective condenser lenses 10, 11 and 12 condense the exciting light L1, since the exciting light L1 having been reflected by the optical element 14 is incident on the second surfaces 10*b*, 11*b* and 12*b*, and the exciting light L1 is emitted from the first surfaces 10*a*, 11*b* and 12*b* toward the fluorescent element 3.

Figure 6:
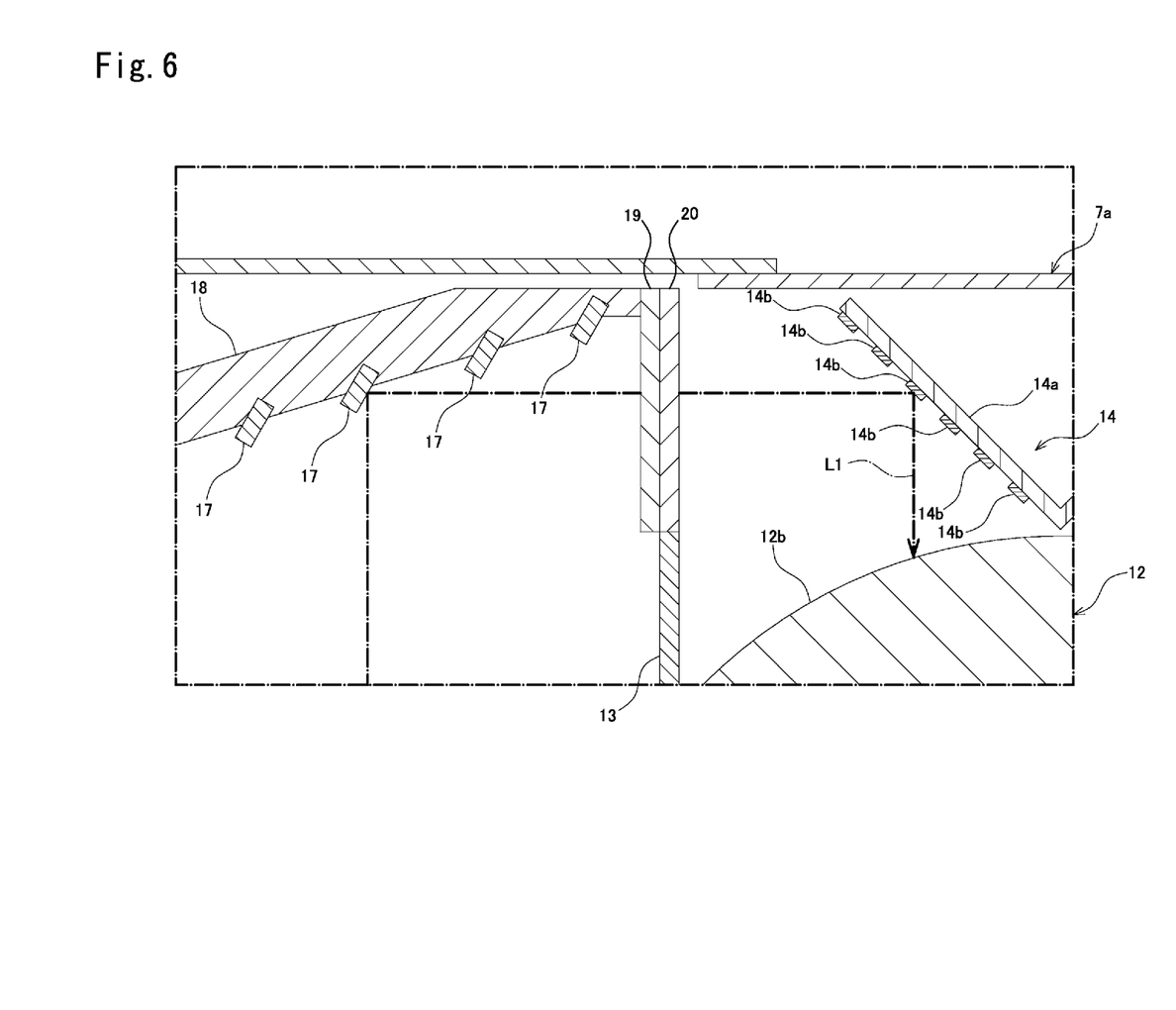
FIG. 6 is a longitudinal cross sectional view of the light source device according to the embodiment, illustrating propagation of exciting light.
Figure 7:
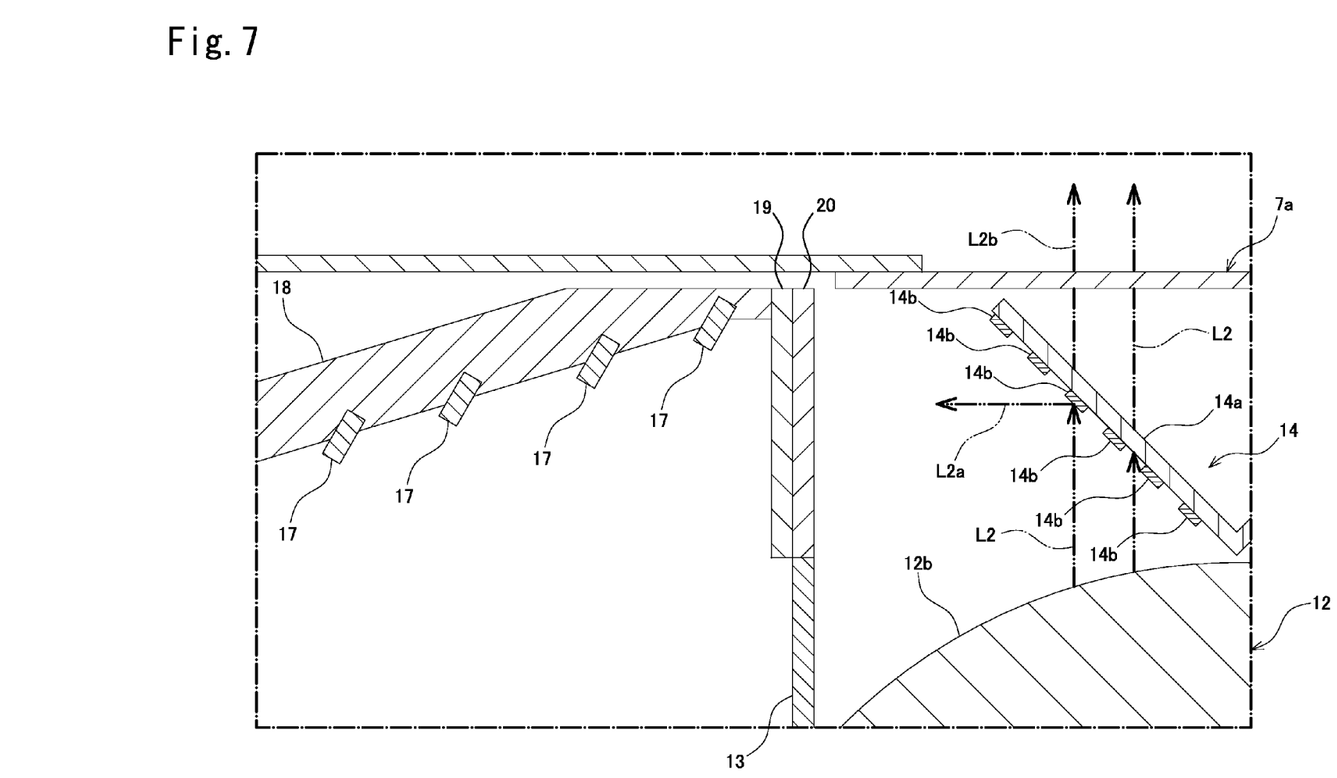
FIG. 7 is a longitudinal cross sectional view of the light source device according to the embodiment, illustrating propagation of reflected light.

As illustrated in FIG. 6 and FIG. 7, the optical element 14 includes a base portion 14*a* with translucency, and reflection portions 14*b* placed on the base portion 14*a* at portions thereof for reflecting the exciting light L1 having passed through the diffusion plate 20. In the present embodiment, the base portion 14*a* is formed from an optical glass, and the reflection portions 14*b* are formed from a dielectric multi-layer film.

On the other hand, in the present embodiment, the exciting light L1 emitted from the light emitting elements 2 is linearly-polarized laser light composed of only S-polarized light components. Further, these polarized light components of this exciting light L1 are maintained even after having passed through the collimator lens 15, the reflection mirror 17, the prism lens 19 and a diffusion plate 20.

For coping therewith, the reflection portions 14*b* are placed at positions to which the exciting light L1 having passed through the diffusion plate 20 is incident. Further, the reflection portions 14*b* are adapted to reflect S-polarized light components and, also, to pass P-polarized light components therethrough. Thus, as illustrated in FIG. 6, when the exciting light L1, which is linearly-polarized light having only S-polarized light components, is incident on a reflection portion 14*b*, the exciting light L1 is reflected by the reflection portion 14*b* and is incident on the second surface 12*b* of the third condenser lens 12.

On the other hand, the polarized light components of the reflected light L2 having been reflected by the fluorescent element 3 include not only S-polarized light components, but also P-polarized light components. Thus, as illustrated in FIG. 7, when the reflected light L2 is incident on a reflection portion 14*b*, light L2*a* having S-polarized light components is reflected by the reflection portion 14*b*, while light L2*b* having P-polarized light components passes through the reflection portion 14*b* and, further, passes through the base portion 14*a*. Further, when the reflected light L2 is incident on a position between reflection portions 14*b* and 14*b*, namely when the reflected light L2 directly is incident on the base portion 14*a*, the reflected light L2 passes through the base portion 14*a*.

Further, the light L2, L2*b* having passed through the optical element 14 passes through the emission port portion 7*a* of the casing 7 and is emitted toward the outside. At this time, the light emitted through the emission port portion 7*a* forms white light, since the yellow green light (fluorescence) resulted from the conversion by the fluorescent element 3 and the blue light (un-converted light) having not been subjected to the conversion by the fluorescent element 3 are mixed with each other.

As described above, the light source device 1 according to the embodiment includes: a light emitting element 2 adapted to emit exciting light L2; a fluorescent element 3 having a phosphor and adapted to convert at least a portion of the exciting light L1 emitted from the light emitting element 2 into fluorescence and to reflect the fluorescence; and a common cooling member 4 adapted to cool the light emitting element 2 and the fluorescent element 3, the cooling member 4 includes a first cooling surface 8*c* coupled to the light emitting element 2 for cooling the light emitting element 2, and a second cooling surface 8*d* coupled to the fluorescent element 3 for cooling the fluorescent element 3, and the first cooling surface 8*c* and the second cooling surface 8*d* are placed in parallel with each other and are placed in such a way as to be oriented in the same direction.

With this structure, the first cooling surfaces 8*c* coupled to the light emitting elements 2 for cooling the light emitting elements 2, and the second cooling surface 8*d* coupled to the fluorescent element 3 for cooling the fluorescent element 3 are placed in parallel with each other. Furthermore, the first cooling surfaces 8*c* and the second cooling surface 8*d* are placed in such a way as to be oriented in the same direction. Thus, in the structure for cooling the light emitting elements 2 and the fluorescent element 3 with the common cooling member 4, it is possible to enable reduction of the size of the cooling member 4, namely reduction of the size of the light source device 1, for example.

In the light source device 1 according to the embodiment, the first cooling surface 8*c* and the second cooling surface 8*d* are placed in the same plane.

With this structure, the first cooling surfaces 8*c* and the second cooling surface 8*d* are placed in the same plane, which can simplify the structure of the cooling member 4, for example. This makes it easier to fabricate the cooling member 4, for example.

In the light source device 1 according to the embodiment, the light source device includes at least one condenser lens (in particular, three condenser lenses) 10, 11 and 12 adapted to condense reflected light L2 having been reflected by the fluorescent element 3, such that the reflected light L2 is incident on first surfaces 10*a*, 11*a* and 12*a*, and the reflected light L2 is emitted from second surfaces 10*b*, 11*b* and 12*b*, the condenser lenses 10, 11 and 12 are adapted to condense the exciting light L1 emitted from the light emitting element 2, such that the exciting light L1 is incident on the second surfaces 10*b*, 11*b* and 12*b*, and the exciting light L1 is emitted from the first surfaces 10*a*, 11*a* and 12*a* toward the fluorescent element 3.

With this structure, the condenser lenses 10, 11 and 12 condense the exciting light L1, since the exciting light L1 emitted from the light emitting elements 2 is incident on the second surfaces 10*b*, 11*b* and 12*b*, and the exciting light L1 is emitted from the first surfaces 10*a*, 11*b* and 12*b* toward the fluorescent element 3. Further, the condenser lenses 10, 11 and 12 condense the reflected light L2, since the reflected light L2 having been reflected by the fluorescent element 3 is incident on the first surfaces 10*a*, 11*a* and 12*a*, and the reflected light L2 is emitted from the second surfaces 10*b*, 11*b* and 12*b*.

Thus, the condenser lenses 10, 11 and 12 for condensing the exciting light L1 proceeding toward the fluorescent element 3, and the condenser lenses 10, 11 and 12 for condensing the reflected light L2 reflected by the fluorescent element 3 can be made to be common with each other. This enables reduction of the sizes of the condenser lenses 10, 11 and 12, namely reduction of the size of the light source device 1, for example.

In the light source device 1 according to the embodiment, the light source device 1 includes a lens holding member 13 which is adapted to hold the condenser lenses 10, 11 and 12 and is coupled to the second cooling surface 8*d* for cooling the condenser lenses 10, 11 and 12, the lens holding member encloses the fluorescent element 3, in cooperation with the condenser lens 12 and the second cooling surface 8*d*.

With this structure, the lens holding member 13 for holding the condenser lenses 10, 11 and 12 is coupled to the second cooling surface 8*d*, which can cool the lens holding member 13 and the condenser lenses 10, 11 and 12. This can suppress thermal deterioration of the condenser lenses 10, 11 and 12. Further, this can suppress thermal expansion of the lens holding member 13, which can suppress positional displacement of the condenser lenses 10, 11 and 12.

Further, the lens holding member 13 encloses the fluorescent element 3, in cooperation with the condenser lens 10 and the second cooling surface 8*d*, which can prevent dusts and the like from adhering to the fluorescent element 3. This can prevent degradation of the fluorescence conversion performance of the phosphor in the fluorescent element 3.

In the light source device 1 according to the embodiment, the first cooling surface 8*c* has higher cooling ability than cooling ability of the second cooling surface 8*d*.

With this structure, since the first cooling surfaces 8*c* have higher cooling ability than the cooling ability of the second cooling surface 8*d*, it is possible to properly cool the light emitting elements 2 which generate larger amounts of heat than the amount of heat generated from the fluorescent element 3.

The light source device is not limited to the configuration of the embodiment described above, and the effects are not limited to those described above. It goes without saying that the light source device can be variously modified without departing from the scope of the subject matter of the present invention. For example, the constituents, methods, and the like of various modified examples described below may be arbitrarily selected and employed as the constituents, methods, and the like of the embodiments described above, as a matter of course.

Figure 8:
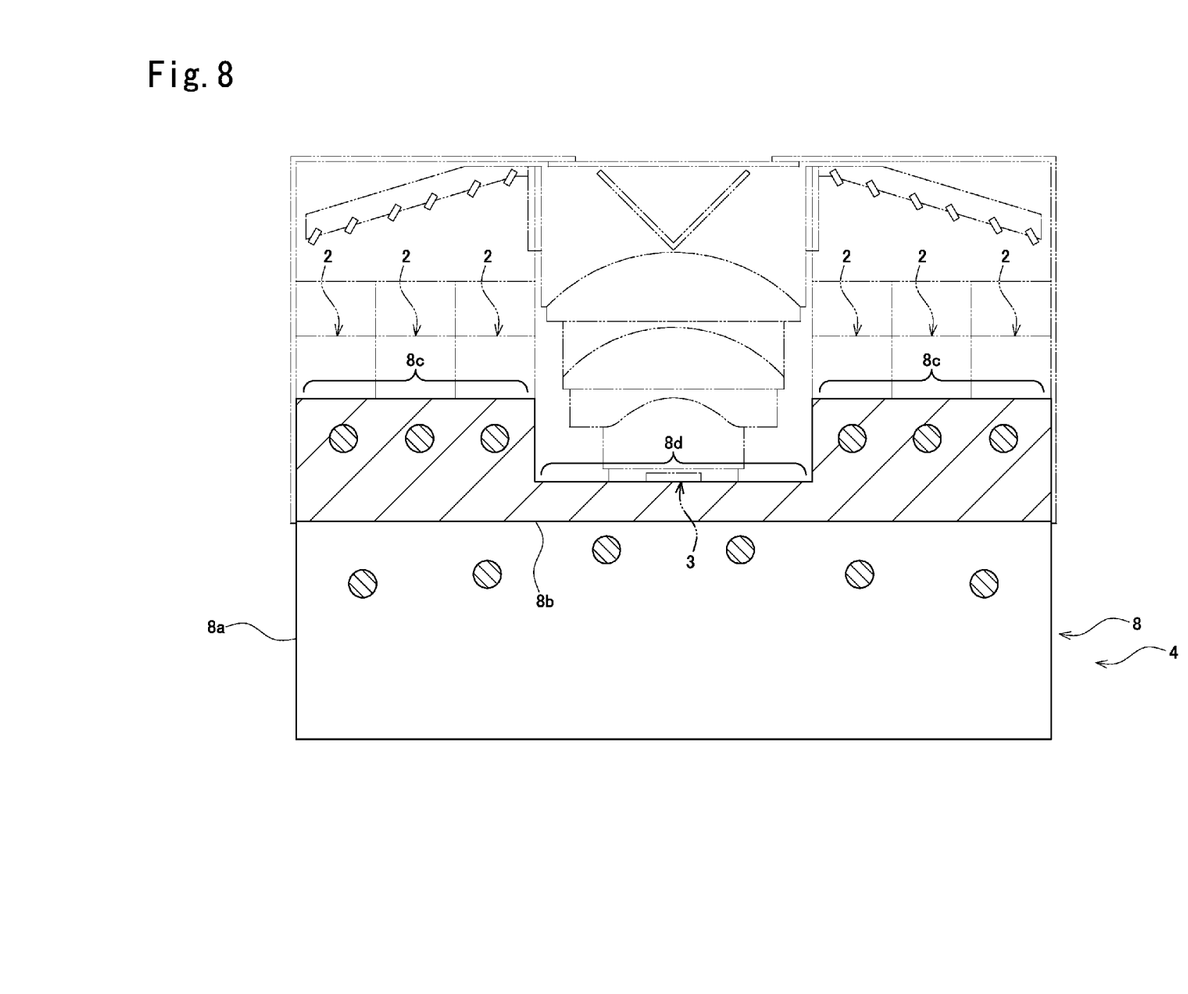
FIG. 8 is a longitudinal cross sectional view of entirety of a light source device according to another embodiment.

In the light source device 1 according to the embodiment, the first cooling surfaces 8*c* and the second cooling surface 8*d* are placed in the same plane. However, the light source device is not limited to this structure. For example, the light source device can be also adapted such that the first cooling surfaces 8*c* and the second cooling surface 8*d* are placed at different levels, as illustrated in FIG. 8. Namely, the first cooling surfaces 8*c* and the second cooling surface 8*d* are required only to be placed in parallel with each other and, also, to be placed in such a way as to be oriented in the same direction.

Further, the light source device 1 according to the embodiment is adapted such that the fluorescent element 3 converts a portion of the exciting light L1 emitted from the light emitting elements 2 into fluorescence and reflects the fluorescence. However, the light source device is not limited to this structure. For example, the light source device can be also adapted such that the fluorescent element 3 converts the entire exciting light emitted from the light emitting elements 2 into fluorescence and reflects the fluorescence.

Further, the light source device 1 according to the embodiment is adapted such that the light emitting elements 2 are placed in the opposite sides beside the fluorescent element 3 in such a way as to sandwich the fluorescent element 3, and the first cooling surfaces 8*c* are placed in the opposite sides beside the second cooling surface 8*d* in such a way as to sandwich the second cooling surface 8*d*. However, the light source device is not limited to this structure. For example, the light source device can be also adapted such that the light emitting elements 2 are placed only in one side beside the fluorescent element 3, and the first cooling surfaces 8*c* are placed only in one side beside the second cooling surface 8*d*.

Further, the light source device 1 according to the embodiment is adapted such that the heat pipes 9 are placed near the first cooling surfaces 8*c*, so that the first cooling surfaces 8*c* have higher cooling ability than the cooling ability of the second cooling surface 8*d*. However, the light source device is not limited to this structure.

For example, the light source device can be also adapted such that the fins 8*a* placed near the first cooling surfaces 8*c* have a larger surface area than the surface area of the fins 8*a* placed near the second cooling surface 8*d*, so that the first cooling surfaces 8*c* have higher cooling ability than the cooling ability of the second cooling surface 8*d*. Also, for example, the light source device can be also adapted such that the first cooling surfaces 8*c* have the same cooling ability as the cooling ability of the second cooling surface 8*d*.

Further, the light source device 1 according to the embodiment is adapted such that the plural condenser lenses 10, 11 and 12 for condensing the exciting light L1 proceeding toward the fluorescent element 3, and the plural condenser lenses 10, 11 and 12 for condensing the reflected light L2 having been reflected by the fluorescent element 3 are all made to be common with each other. However, the light source device is not limited to this structure.

Further, the light source device can be also adapted such that the plural condenser lenses for condensing the exciting light L1 proceeding toward the fluorescent element 3, and the plural condenser lenses for condensing the reflected light L2 having been reflected by the fluorescent element 3 are partially made to be common with each other. Further, for example, the light source device can be also adapted such that the condenser lenses for condensing the exciting light L1 proceeding toward the fluorescent element 3, and the condenser lenses for condensing the reflected light L2 having been reflected by the fluorescent element 3 are not made to be common with each other at all and are constituted by completely different members.

DESCRIPTION OF REFERENCE SIGNS

1 Light source device
2 Light emitting element
2a Light emitting portion
3 Fluorescent element
4 Cooling member
5 First optical system (exciting light optical system)
6 Second optical system (reflected-light optical system)
7 Casing
7a Emission port portion
8 Heat sink
8a Fin
8b Base member
8c First cooling surface
8d Second cooling surface
9 Heat pipe
10, 11 and 12 Condenser lens
10a, 11a and 12a First surface
10b, 11b and 12b Second surface
13 Lens holding member
14 Optical element
14a Base portion
14b Reflection portion
15 Collimator lens
16 Collimator lens supporting member
17 Reflection mirror
18 Mirror supporting member
19 Prism lens
20 Diffusion plate

The invention claimed is:

1. A light source device comprising:
a light emitting element adapted to emit exciting light;
a fluorescent element having a phosphor and adapted to convert at least a portion of the exciting light emitted from the light emitting element into fluorescence and to reflect the fluorescence; and
a common cooling member adapted to cool the light emitting element and the fluorescent element, wherein
the cooling member includes a first cooling surface coupled to the light emitting element for cooling the light emitting element, and a second cooling surface coupled to the fluorescent element for cooling the fluorescent element,
the first cooling surface and the second cooling surface are placed in parallel with each other and are placed in such a way as to be oriented in the same direction,
the light source device comprises:
at least one condenser lens adapted to condense reflected light having been reflected by the fluorescent element, such that the reflected light is incident on a first surface, and the reflected light is emitted from a second surface; and
a lens holding member which is adapted to hold the condenser lens and is coupled to the second cooling surface for cooling the condenser lens,
the condenser lens is adapted to condense the exciting light emitted from the light emitting element, such that the exciting light is incident on the second surface, and the exciting light is emitted from the first surface toward the fluorescent element, and
the lens holding member encloses the fluorescent element, in cooperation with the condenser lens and the second cooling surface.

2. The light source device according to claim 1, wherein the first cooling surface and the second cooling surface are placed in the same plane.

3. The light source device according to claim 1, wherein the first cooling surface has higher cooling ability than cooling ability of the second cooling surface.

* * * * *